(12) United States Patent
Wu

(10) Patent No.: US 9,935,145 B2
(45) Date of Patent: *Apr. 3, 2018

(54) IMAGE SENSOR WITH PIXELS HAVING INCREASED OPTICAL CROSSTALK

(71) Applicant: OMNIVISION TECHNOLOGIES, INC., Santa Clara, CA (US)

(72) Inventor: Raymond Wu, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 14/926,220

(22) Filed: Oct. 29, 2015

(65) Prior Publication Data

US 2017/0125470 A1    May 4, 2017

Related U.S. Application Data

(62) Division of application No. 13/850,069, filed on Mar. 25, 2013, now Pat. No. 9,215,430.

(Continued)

(51) Int. Cl.
*H04N 5/335* (2011.01)
*H04N 5/374* (2011.01)
(Continued)

(52) U.S. Cl.
CPC ...... *H01L 27/14627* (2013.01); *G02B 3/0056* (2013.01); *G02B 5/201* (2013.01); *G02B 27/123* (2013.01); *G06T 19/006* (2013.01); *H01L 27/146* (2013.01); *H01L 27/14621* (2013.01); *H01L 27/14645* (2013.01);
(Continued)

(58) Field of Classification Search
CPC . H01L 27/146; H01L 31/06; H01L 27/14627; H01L 27/14621; H01L 27/14645; H04N 5/335; H04N 5/374; H04N 5/378; H04N 9/045; G06T 19/006; G02B 27/123; G02B 3/0056
USPC ............ 348/241, 243, 273, 223.1, 277, 655; 257/98, 184, 222, 291, 292; 250/208.1; 438/70, 170; 370/201; 345/611–616; 382/269

See application file for complete search history.

(56) References Cited

U.S. PATENT DOCUMENTS 7,068,432 B2  6/2006  Boettiger et al.
8,097,890 B2  1/2012  Qian et al.
(Continued)

OTHER PUBLICATIONS

CN 201410064275.1—First Office Action with English Translation, dated May 12, 2016, 12 pages.
(Continued)

*Primary Examiner* — Lin Ye
*Assistant Examiner* — Marly Camargo
(74) *Attorney, Agent, or Firm* — Christensen O'Connor; Johnson Kindness PLLC

(57) ABSTRACT

An image sensor includes a first pixel and a second pixel. The first pixel includes a first light sensitive element, a first light filter, and a first microlens. The second pixel is disposed adjacent to the first pixel and includes a second light sensitive element, a second light filter, and a second microlens. The first pixel is configured to direct at least some of the light received at the first microlens to the second light sensitive element of the second pixel to increase optical crosstalk so as to reduce color aliasing.

9 Claims, 12 Drawing Sheets

Related U.S. Application Data

(60) Provisional application No. 61/789,013, filed on Mar. 15, 2013.

(51) Int. Cl.

| | | |
|---|---|---|
| *H04N 5/359* | (2011.01) | |
| *H04N 5/378* | (2011.01) | |
| *H01L 27/146* | (2006.01) | |
| *G02B 27/12* | (2006.01) | |
| *G02B 3/00* | (2006.01) | |
| *H04N 9/04* | (2006.01) | |
| *G06T 19/00* | (2011.01) | |
| *H01L 31/06* | (2012.01) | |
| *G02B 5/20* | (2006.01) | |
| *G06K 9/00* | (2006.01) | |
| *H04N 9/083* | (2006.01) | |

(52) U.S. Cl.
CPC ............ *H01L 31/06* (2013.01); *H04N 5/335* (2013.01); *H04N 5/374* (2013.01); *H04N 5/378* (2013.01); *H04N 9/045* (2013.01); *G06K 9/00671* (2013.01); *H04N 9/083* (2013.01)

(56) References Cited

U.S. PATENT DOCUMENTS

| | | |
|---|---|---|
| 8,598,508 B2 | 12/2013 | Kanai et al. |
| 8,902,330 B2 | 12/2014 | Theuwissen |
| 2005/0270651 A1* | 12/2005 | Boettiger ......... B29D 11/00278 359/618 |
| 2007/0076299 A1* | 4/2007 | Boettiger ......... B29D 11/00278 359/619 |
| 2007/0206241 A1 | 9/2007 | Smith et al. |
| 2008/0142685 A1 | 6/2008 | Gazeley |
| 2009/0128671 A1 | 5/2009 | Kusaka |
| 2010/0052085 A1 | 3/2010 | Park |
| 2010/0283112 A1 | 11/2010 | Tay |
| 2011/0031418 A1* | 2/2011 | Shcherback ......... G01N 21/86 250/559.29 |
| 2012/0104525 A1 | 5/2012 | Wu et al. |
| 2012/0147230 A1 | 6/2012 | Vaillant et al. |
| 2012/0206635 A1* | 8/2012 | Kikuchi .................. H04N 5/359 348/187 |
| 2013/0001724 A1* | 1/2013 | Masuda ............ H01L 27/14623 257/432 |
| 2013/0113958 A1* | 5/2013 | Chen .................... H04N 5/3572 348/223.1 |
| 2014/0267890 A1 | 9/2014 | Lelescu et al. |
| 2015/0108331 A1* | 4/2015 | Masuda ............ H01L 27/14623 250/208.1 |
| 2015/0373261 A1* | 12/2015 | Rodda ................ H04N 5/23232 348/218.1 |

OTHER PUBLICATIONS

TW 103108873—First Taiwanese Office Action and Search Report with English Translation, dated Jan. 5, 2016, 9 pages.
U.S. Appl. No. 13/850,069—Requirement for Restriction, dated Oct. 20, 2014, 9 pages.
U.S. Appl. No. 13/850,069—Non-Final Office Action, dated Mar. 2, 2015, 21 pages.
U.S. 13/850,069—Notice of Allowance, dated Aug. 3, 2015, 14 pages.
TW 105112334—First Taiwanese Office Action and Search Report with English Translation, dated Nov. 4, 2016, 7 pages.
CN 201410064275.1—Second Office Action with English Translation, dated Dec. 30, 2016, 5 pages.

\* cited by examiner

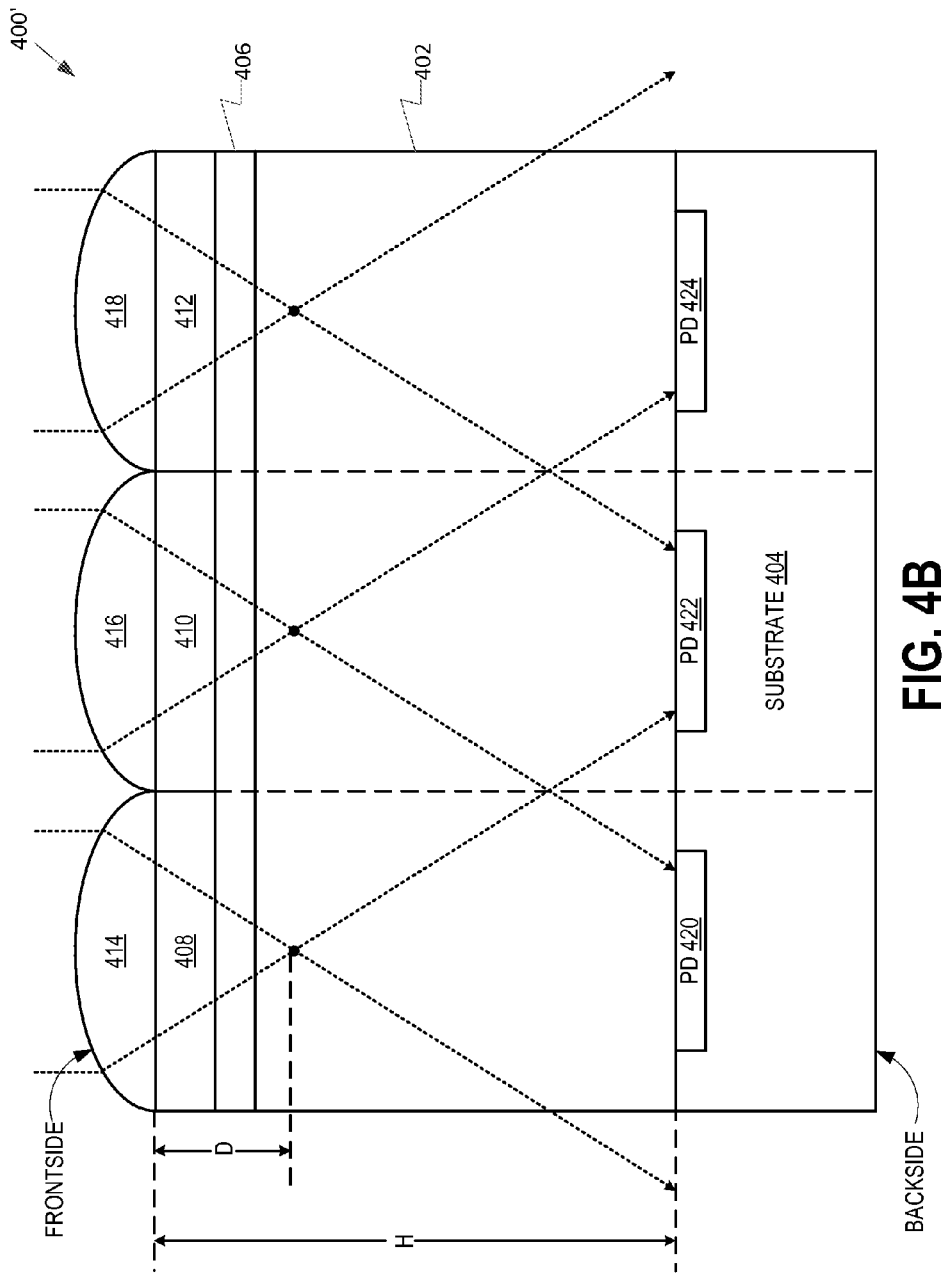

IMAGE SENSOR WITH PIXELS HAVING INCREASED OPTICAL CROSSTALK

CROSS-REFERENCE TO RELATED APPLICATIONS

This application is a divisional of U.S. patent application Ser. No. 13/850,069, filed 25 Mar. 2013, which claims the benefit of U.S. Provisional Application No. 61/789,013, filed 15 Mar. 2013. Application Ser. No. 13/850,069 and Provisional Application No. 61/789,013 are hereby incorporated by reference.

TECHNICAL FIELD

This disclosure relates generally to image sensors, and in particular but not exclusively, relates to optical crosstalk in CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors.

Conventional CMOS image sensors use color filter arrays such as red, green, and blue (RGB), arranged in what is known as a Bayer pattern. In addition, clear pixels, also known as panchromatic pixels, may be included in the color filter array in order to increase the sensitivity of the image sensors. A color filter array that includes clear pixels in addition to the RGB color filters may be referred to as being arranged into an RGBC pixel pattern.

However, some RGBC patterns may suffer from color aliasing. Color aliasing refers to the effect of the wrong color appearing in an area of the image. For example, a color such as red or blue may be seen in an area that should be green. Color aliasing occurs at least partly due to the alignment of the clear filters within the RGBC pattern. Image sensors with clear pixels are more prone to color aliasing since clear pixels do not produce any color information of their own other than the intensity of light.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 4B is a cross-sectional view of three pixels of a front side illuminated imaging sensor with increased crosstalk, in accordance with an embodiment of the present disclosure.

DETAILED DESCRIPTION

Embodiments of an Image Sensor with Pixels having Increased Optical Crosstalk are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
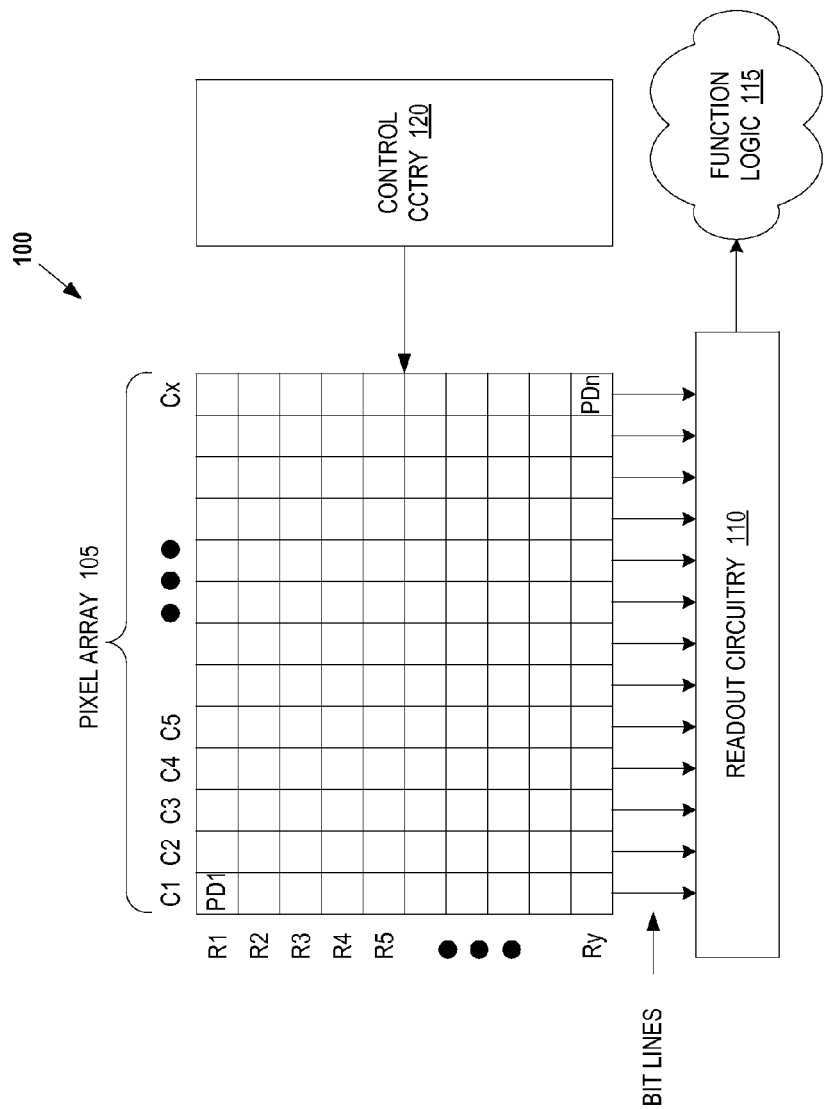
FIG. 1 is a block diagram illustrating an image sensor, in accordance with an embodiment of the present disclosure.

FIG. 1 is a block diagram illustrating an image sensor 100, in accordance with an embodiment of the present disclosure. The illustrated embodiment of image sensor 100 includes an active area (i.e., pixel array 105), readout circuitry 110, function logic 115, and control circuitry 120.

Pixel array 105 may be a two-dimensional array of backside or frontside illuminated imaging pixels (e.g., pixels PD1, . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render an image of the person, place, or object.

After each pixel has acquired its image data or image charge, the image data is read out by readout circuitry 110 and transferred to function logic 115. Readout circuitry 110 may include amplification circuitry, analog-to-digital conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may read out a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristics of pixel array 105. For example, control circuitry 120 may generate a shutter signal for controlling image acquisition.

Figure 2:
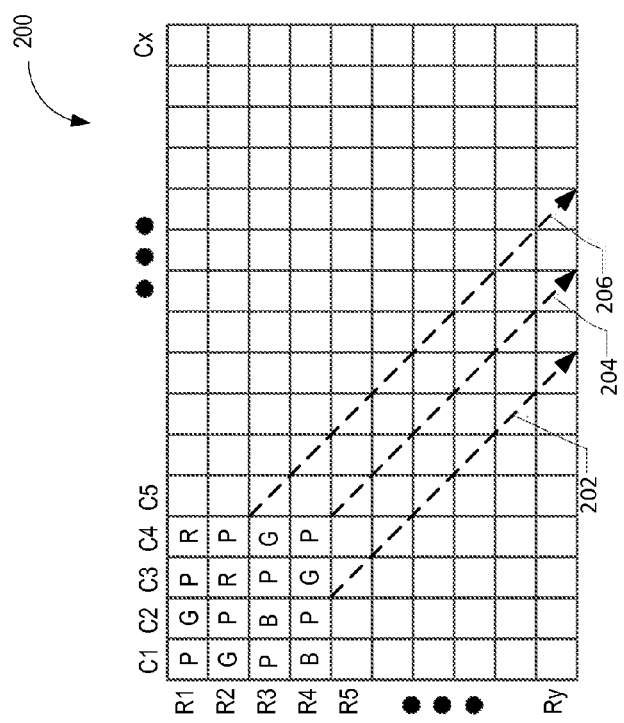
FIG. 2 is a diagram of an array of pixels of an image sensor illustrating an RGBC pattern, in accordance with an embodiment of the present disclosure.

FIG. 2 is a diagram of an array 200 of pixels of an image sensor illustrating an RGBC pattern, in accordance with an embodiment of the present disclosure. Array 200 is one possible implementation of pixel array 105 of FIG. 1. Several color imaging pixels may be included in the active area of an image sensor, such as red (R), green (G), and blue (B) imaging pixels. Also included in the image sensor are clear, or otherwise known as panchromatic (P) pixels. FIG. 2 shows one possible RGBC pattern where the clear (i.e., panchromatic (P)) pixels are arranged along the diagonals 204-206 of array 200 to form a checkerboard pattern. However, when clear pixels are arranged on the diagonal, color aliasing will likely happen. As mentioned above, color aliasing refers to the effect of the wrong color appearing in an area of the image. For example, a color such as red or blue may be seen in an area that should be green. In the RGBC pattern shown in FIG. 2, color aliasing may occur in the diagonal directions 204-206, at least partly due to the alignment of the clear filters along those diagonal directions.

Accordingly, embodiments of the present disclosure intentionally increase optical crosstalk in the pixel array in order to reduce the effect of color aliasing. Optical crosstalk refers to when light directed at a target pixel strays into neighboring pixels. In conventional image sensors, optical crosstalk is an unfavorable effect that is mitigated because light straying from neighboring pixels may tend to distort the true color information of the target pixel. However, optical crosstalk has the unexpected benefit of blending the color of the target pixel with its neighboring pixels, thereby reducing color aliasing. Embodiments of the present disclosure intentionally induce and/or increase optical crosstalk as a desirable feature of CMOS image sensors to reduce the effects of color aliasing.

Figure 3:
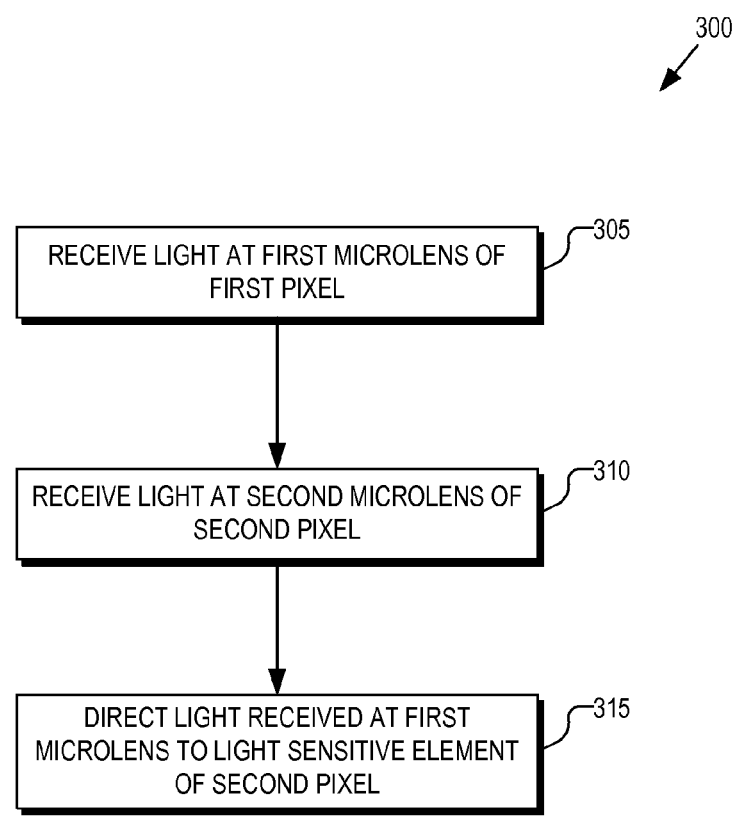
FIG. 3 is a flowchart illustrating a process of reducing color aliasing, in accordance with an embodiment of the present disclosure.
Figure 4A:
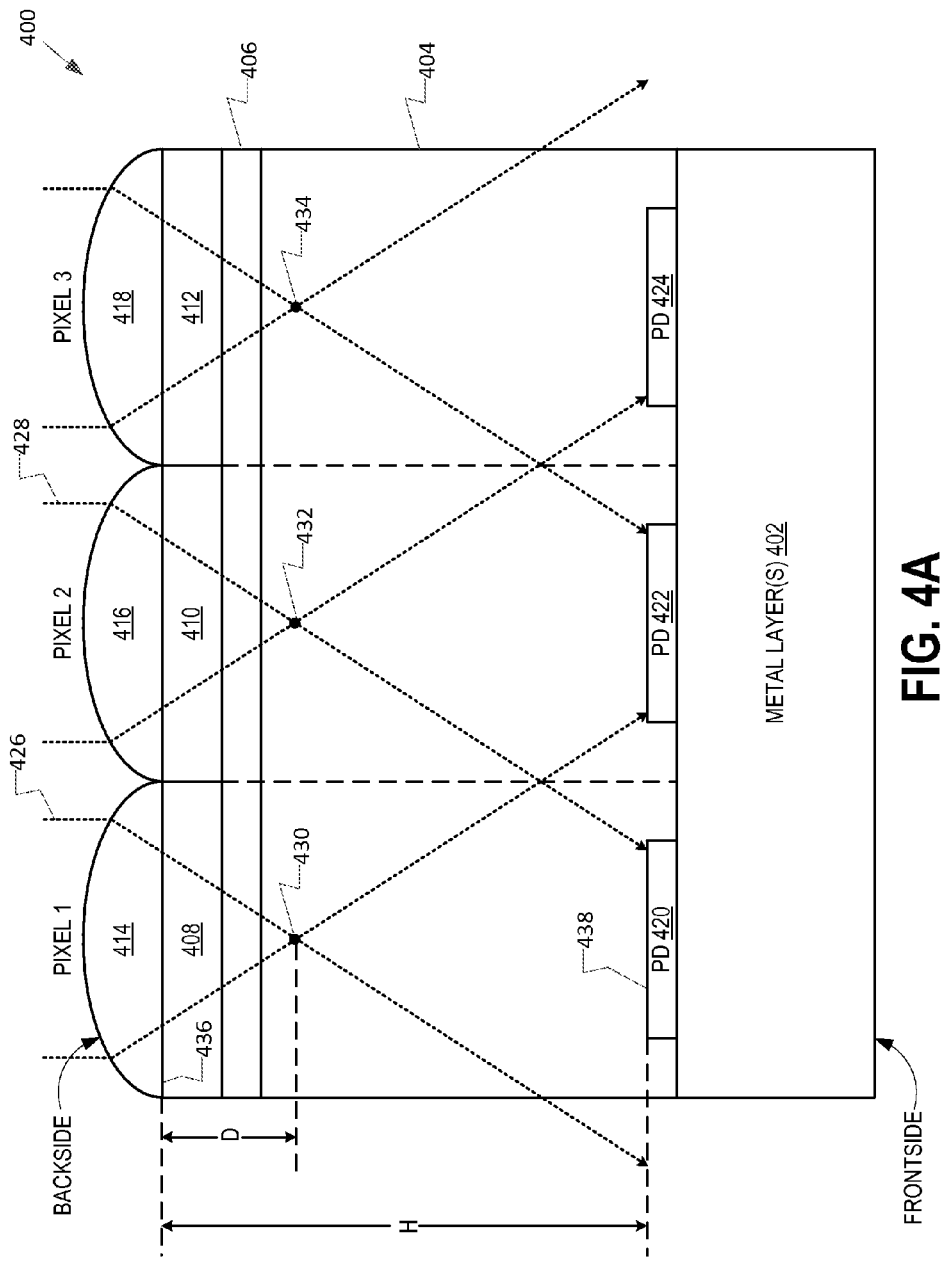
FIG. 4A is a cross-sectional view of three pixels of a backside illuminated imaging sensor with increased crosstalk, in accordance with an embodiment of the present disclosure.

FIG. 3 is a flowchart illustrating a process 300 of reducing color aliasing, in accordance with an embodiment of the present disclosure. As shown in FIG. 3, process 300 includes, a first process block 305 of receiving light at a first microlens of a first pixel. In process block 310, light is also received at a second microlens of a second pixel. In process block 315 the light received at the first microlens is directed to a light sensitive element of the second pixel so as to increase optical crosstalk. By way of example, FIG. 4A is a cross-sectional view of three pixels (i.e., PIXEL 1, PIXEL 2, and PIXEL 3) of a backside illuminated imaging (BSI) sensor 400 with increased optical crosstalk. Imaging sensor 400 is one possible implementation of at least some of the pixels included in pixel array 105 of FIG. 1.

The illustrated example of imaging sensor 400 is shown as including a metal layer(s) 402 disposed on a front side (i.e., the bottom side as oriented in FIG. 4A) of semiconductor substrate 404 and a planarization/passivation layer 406 disposed on a backside (i.e., the top side) of the semiconductor substrate 404. Each pixel of imaging sensor 400 includes a light filter (i.e., 408-412), a microlenses (i.e., 414-418), and a light sensitive element (i.e., photodiodes 420-424). Microlenses 414-418 of FIG. 4A are convex lenses. More specifically, each microlens has a plano-convex shape. Plano-convex lenses may be referred to as positive lenses since they converge light. FIG. 4A illustrates light received at each pixel being converged to a focal point (i.e., 430, 432, and 434) that is substantially above a light incident side 438 of the photodiodes, such that at least some of the light received at each microlens is directed to the photodiode of an adjacent pixel. For example, light 428 is received at microlens 416, where some of that light is directed to photodiodes 420 and 424 of adjacent pixels 1 and 3, respectively. Similarly, some of light 426 received at microlens 414 is directed to photodiode 422 of adjacent pixel 2. Thus, imaging sensor 400 intentionally induces and/or increases optical crosstalk, which as mentioned above, may reduce the effects of color aliasing.

There are several embodiments of imaging sensor 400 for inducing and/or increasing optical crosstalk. In one embodiment, the pixel can be made taller. In the illustrated example of FIG. 4A, each pixel has a height H that can be measured from a bottom side 436 of the microlenses to the light incident side 438 of the photodiodes. The height H of the pixels may be made greater to increase optical crosstalk by increasing the thickness of one or more elements, such as the microlenses, the light filters, the planarization layer 406, and the semiconductor substrate 404. The height H of the pixels may also be adjusted by changing the junction depth of each photodiode, as will be discussed in more detail below with reference to FIG. 7.

In another embodiment, optical crosstalk may be induced and/or increased by decreasing the effective focal depth of each focal point (i.e., focal points 430, 432, and 434). The effective focal depth D may be approximated as the distance from the bottom-side 436 of the microlens to the focal point, taking into consideration the characteristics of the medium in which light passes through (e.g., microlens, light filter, planarization layer, and substrate). In one example, the effective focal depth D is decreased by changing the material of the microlenses to change (e.g., increasing) the index of refraction. In another example, the curvature of the microlenses may be changed in order to make the effective focal depth D shorter. By way of example, the greater the curvature of the microlens, the shorter the effective focal depth. Yet in another example, changing the thickness of microlens also changes the effective focal depth. By way of example, the thicker the microlens, the shorter the effective focal depth.

Regardless of which embodiment of increasing optical crosstalk is employed, examples disclosed herein provide for an increase in optical crosstalk that is appropriate, yet not excessive. That is, a desirable amount of optical crosstalk may include directing light to adjacent photodiodes and no further. Thus, in one example, light is directed only to photodiodes of immediately adjacent pixels. In one embodiment, this may be accomplished by adjusting pixel height H, effective focal depth D, or a combination of both, such that the effective focal depth D is greater than or equal to one-fourth of the pixel height H. Also to ensure a desired minimum amount of increased optical crosstalk is achieved, the pixel height and/or focal depth D may be adjusted such that the effective focal depth D is less than or equal to one-half the pixel height H.

As mentioned above, imaging sensor 400 is a backside illuminated imaging sensor where light is incident on the backside of imaging sensor 400. However, embodiments disclosed herein are equally applicable to front side illuminated (FSI) imaging sensors as well. For example, FIG. 4B is a cross-sectional view of three pixels of a front side illuminated imaging sensor 400' with increased crosstalk, in accordance with an embodiment of the present disclosure. The illustrated example of front side illuminated imaging sensor 400' is shown as including metal layer(s) 402 disposed on the front side (i.e., top side) of semiconductor substrate 404. Planarization layer 406, light filters 408-418, and microlenses 414-418 are also disposed on a front side (i.e., top side) of the imaging sensor 400'. The embodiments discussed above for inducing and/or increasing optical crosstalk in imaging sensor 400 are equally applicable to the front side illuminated imaging sensor 400' of FIG. 4B, except that the height H of the pixels may be additionally increased by increasing the thickness of metal layer(s) 402.

Figure 5:
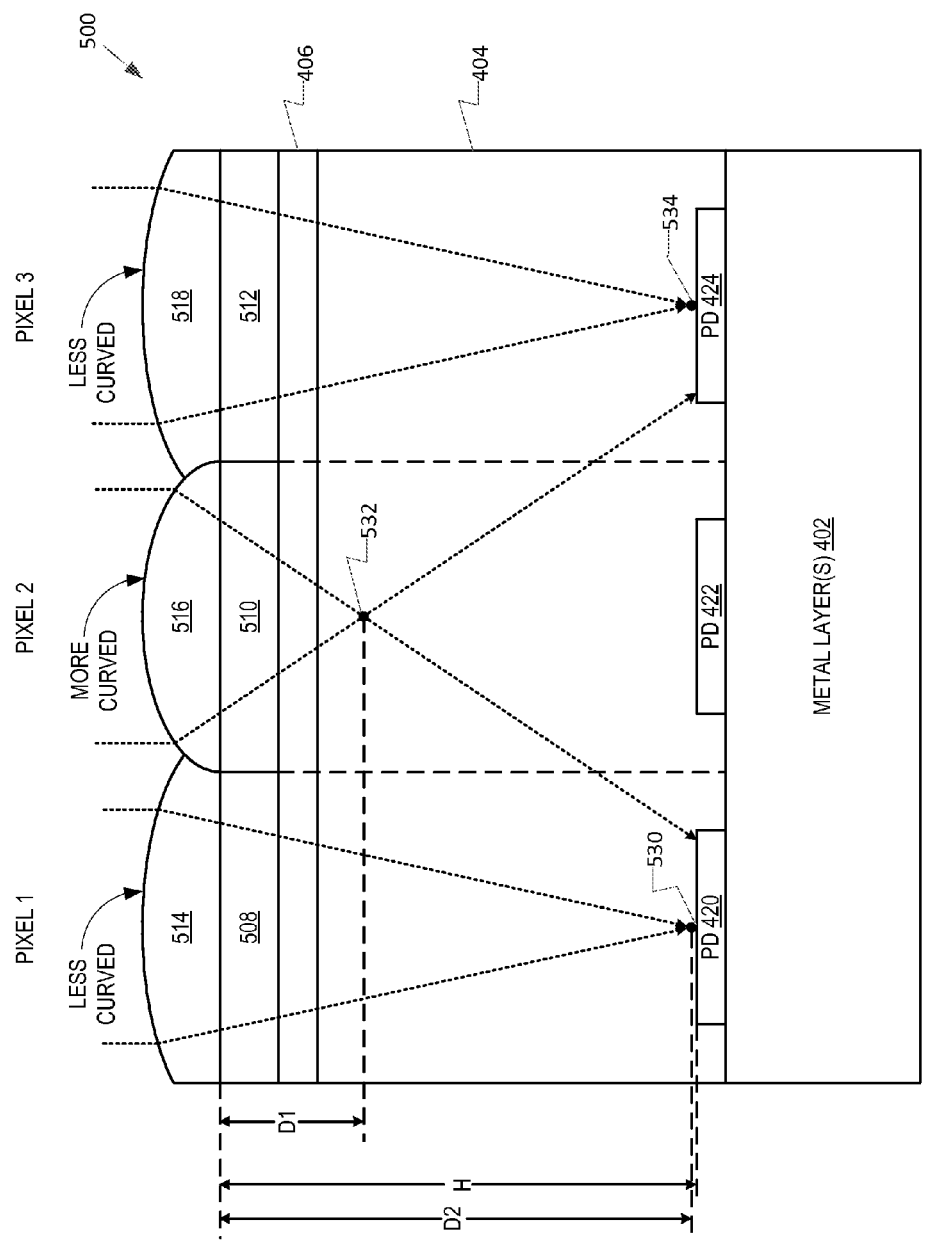
FIG. 5 is a cross-sectional view of three pixels of an imaging sensor having microlenses of varying curvatures, in accordance with an embodiment of the present disclosure.

In the illustrated examples of FIGS. 4A and 4B each pixel has the same pixel height H and effective focal depth D. Thus, each pixel in the array directs incident light onto at least one adjacent pixel. Alternatively, only some pixels may be configured to increase optical crosstalk. That is, some pixels may direct incident light onto the photodiode of an adjacent pixel, while the adjacent pixel contains incident light to its own photodiode. By way of example, it may be advantageous to have color pixels increase crosstalk, but to have clear pixels not. In other words, light incident on color pixels may be directed into neighboring clear pixels, but light incident on clear pixels will substantially remain within the clear pixels. To illustrate, FIG. 5 is a cross-sectional view of three pixels of an imaging sensor 500 having microlenses of varying curvatures, in accordance with an embodiment of the present disclosure. As can be seen, microlens 516 is more curved than adjacent microlenses 514 and 518. Thus, the effective focal depth D2 of focal points 530 and 534 is greater than the effective focal depth D1 of focal point 532. In one embodiment, effective focal depth D2 is greater than one-half the height H of the pixels, so as to contain light within pixels 1 and 3. Also, light filters 508 and 512 may be a clear (i.e., panchromatic) filters, while light filter 510 is a color (e.g., red, green, or blue) filter. In such a manner, light incident on microlens 514 of clear pixel 1 is directed to be substantially incident on photodiode 420 and no other. Similarly, light incident on microlens 518 of clear pixel 3 is directed to be substantially incident on photodiode 424 and no other, while at least some of the light incident on microlens 516 of color pixel 2 is directed to both photodiodes 420 and 424 of the adjacent clear pixels.

One conventional process of fabricating microlenses may involve embossing resin with a press, followed by a heating (reflow) step. As a result, the conventional process may only produce microlenses of convex shape due to surface tension. If a similar amount of resin is used for each microlens, then the resulting microlenses will have substantially the same curvature, and thus the same effective focal depth. To fabricate microlenses with different curvatures, a process that uses a gray scale mask may be employed. For example, a layer of photoresist type microlens material is exposed to a light source through a gray scale mask. Only a single exposure is required. Parts of the microlens layer that are more exposed to light corresponding to the parts of the gray scale mask having higher transmissiveness will have larger thickness or less thickness depending on whether the layer is a negative or positive photoresist. Similarly, parts of microlens layer that are less exposed to light corresponding to the parts of the gray scale mask having lower transmissiveness will have less thickness or larger thickness depending on whether the layer is a negative or positive photoresist. A positive photoresist is a type of photoresist in which the portion of the photoresist that is exposed to light becomes soluble to the photoresist developer. The portion of the photoresist that is unexposed remains insoluble to the photoresist developer. A negative photoresist is a type of photoresist in which the portion of the photoresist that is exposed to light becomes insoluble to the photoresist developer. The unexposed portion of the photoresist is dissolved by the photoresist developer. Thus, microlenses having a variety of curvatures or shapes can be manufactured by developing the exposed positive photoresist or negative photoresist. The curvature or shape of microlenses is according to a pattern of varying transmissiveness of the gray scale mask.

Figure 6:
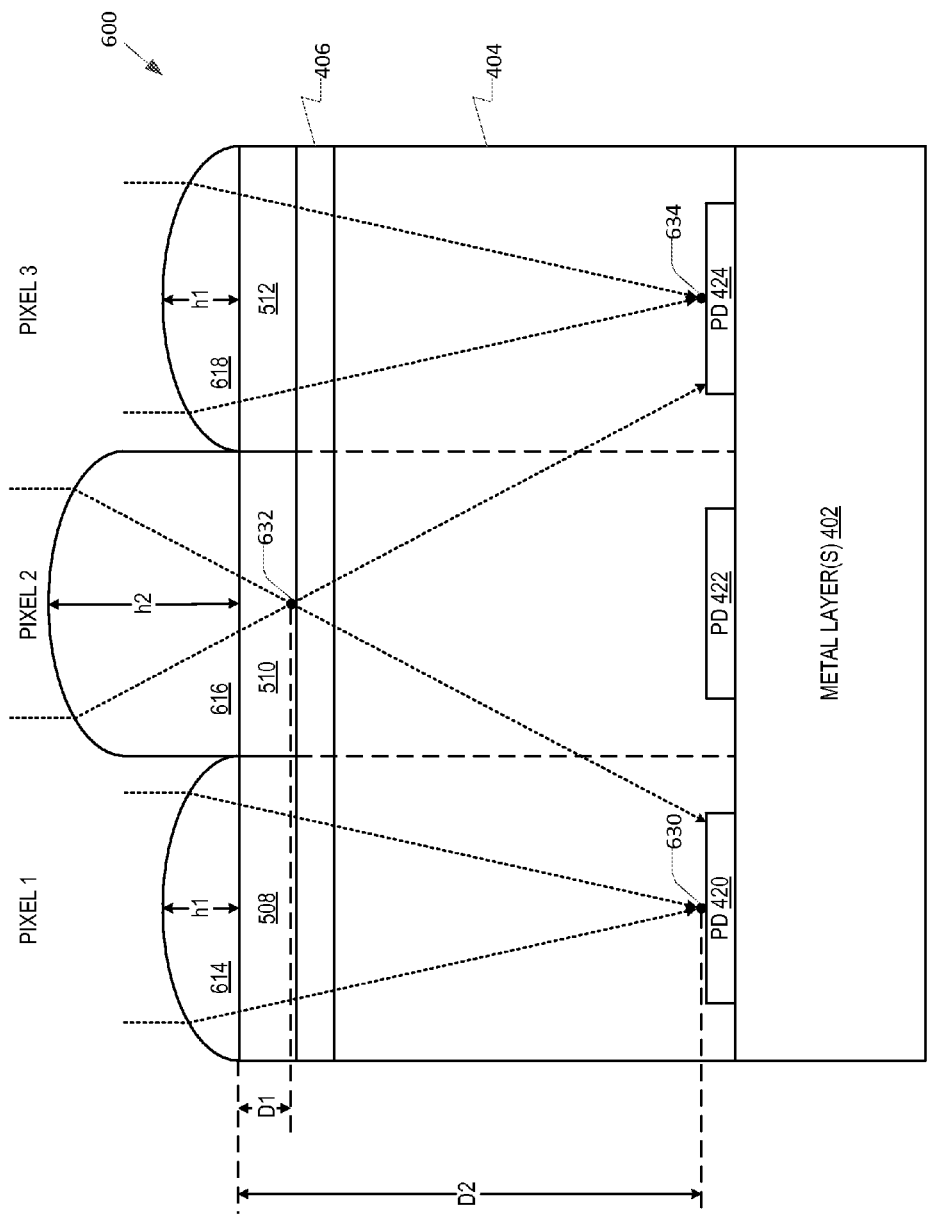
FIG. 6 is a cross-sectional view of three pixels of an imaging sensor having microlenses of varying heights, in accordance with an embodiment of the present disclosure.

FIG. 6 is a cross-sectional view of three pixels of an imaging sensor 600 having microlenses 614-618 of varying heights, in accordance with an embodiment of the present disclosure. As can be seen, microlens 616 is taller than adjacent microlenses 614 and 618. That is, height h2 of microlens 616 is greater than height h1 of adjacent microlenses 614 and 618. Thus, the effective focal depth D2 of focal points 630 and 634 is greater than the effective focal depth D1 of focal point 632, such that light incident on microlens 616 is directed to photodiodes 420 and 424, while light incident on microlenses 614 and 618 is contained within their respective pixels.

Figure 7:
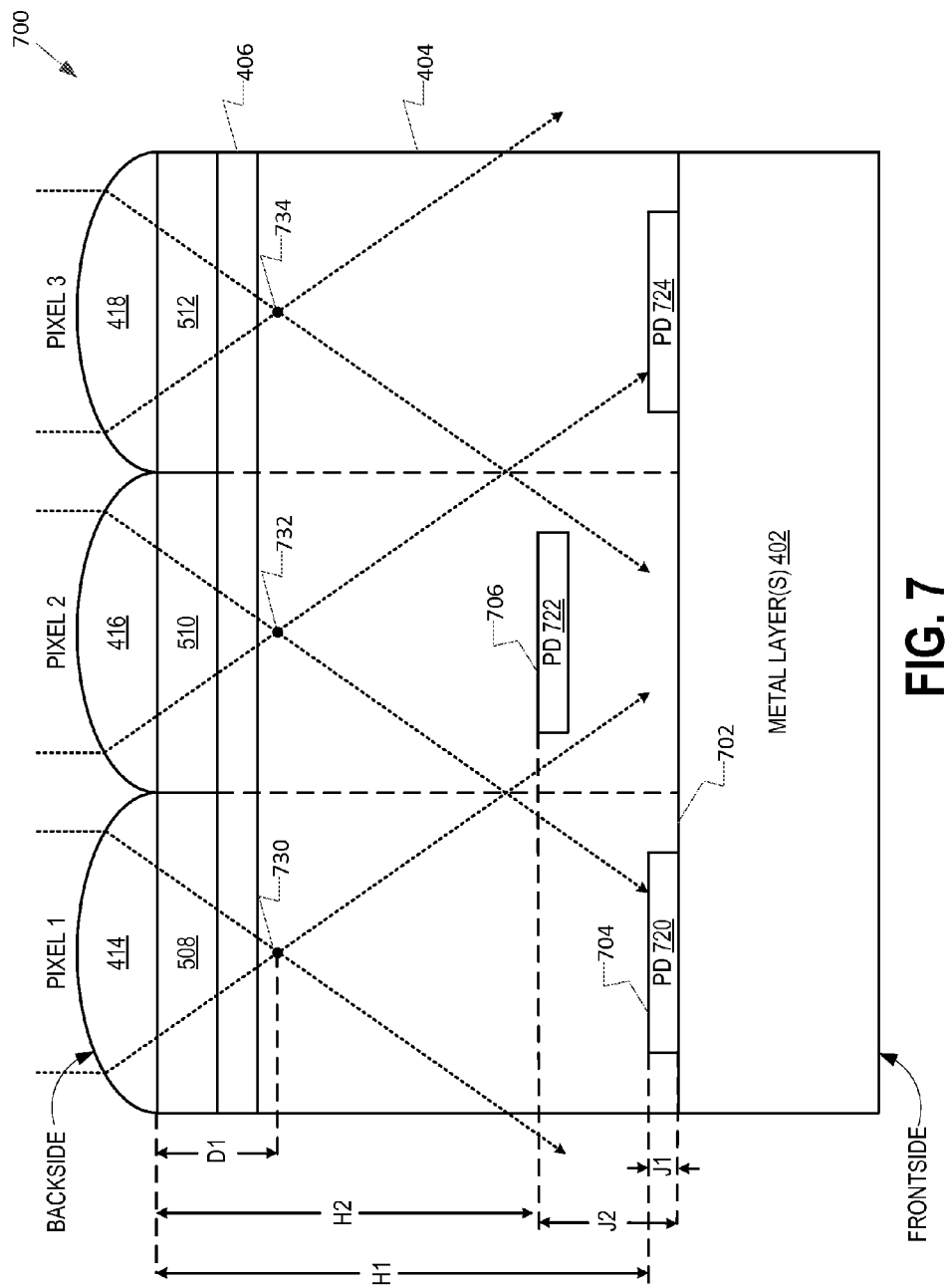
FIG. 7 is a cross-sectional view of three pixels of an imaging sensor having light sensitive elements of varying junction depths, in accordance with an embodiment of the present disclosure.

FIG. 7 is a cross-sectional view of three pixels of an imaging sensor 700 having light sensitive elements (e.g., photodiodes 720-724) of varying junction depths (e.g., J1 and J2), in accordance with an embodiment of the present disclosure. In the illustrated embodiment, junction depth refers to the distance between the front side (i.e., bottom side) surface 702 of semiconductor substrate 404 and a light incident side of the photodiode. For example, the junction depth J1 is measured from the front side surface 702 and light incident side 704 of photodiode 720. Similarly, junction depth J2 is measured from the front side surface 702 and light incident side 706 of photodiode 722. Junction depth may be adjusted during fabrication by adjusting the implantation energies used to implant the photodiode regions 720-724. In one embodiment, the higher the implantation energy the shorter the junction depth. It generally takes more implantation energy to penetrate deeper into the substrate to form the photodiode region, resulting in a shorter junction depth. In the illustrated example of FIG. 7, junction depth J2 of photodiode 722 is greater than the junction depth J1 of the adjacent photodiodes 720 and 724. Thus, as can be seen, light incident on microlens 416 may be directed to the photodiodes 720 and 724 of adjacent pixels 1 and 3, respectively, while light incident on, for example, microlens 414 is not incident on photodiode 722. Therefore, the embodiment of FIG. 7 may allow for the pixel 2 to increase optical crosstalk onto the photodiodes of adjoining pixels, whiles pixels 1 and 3 do not increase optical crosstalk onto the photodiode of pixel 2.

The aforementioned microlenses of FIGS. 4A-7 have been shown and described as convex microlenses, which may also be referred to as positive converging microlenses. In another embodiment to increase optical crosstalk, at least some of the microlenses may be fabricated to be negative, or light-diverging microlenses. In one embodiment, this is achieved by fabricating the microlens to be of a concave shape. Since concave microlenses cause light to diverged, they may naturally increase optical crosstalk between neighboring pixels.

Figure 8:
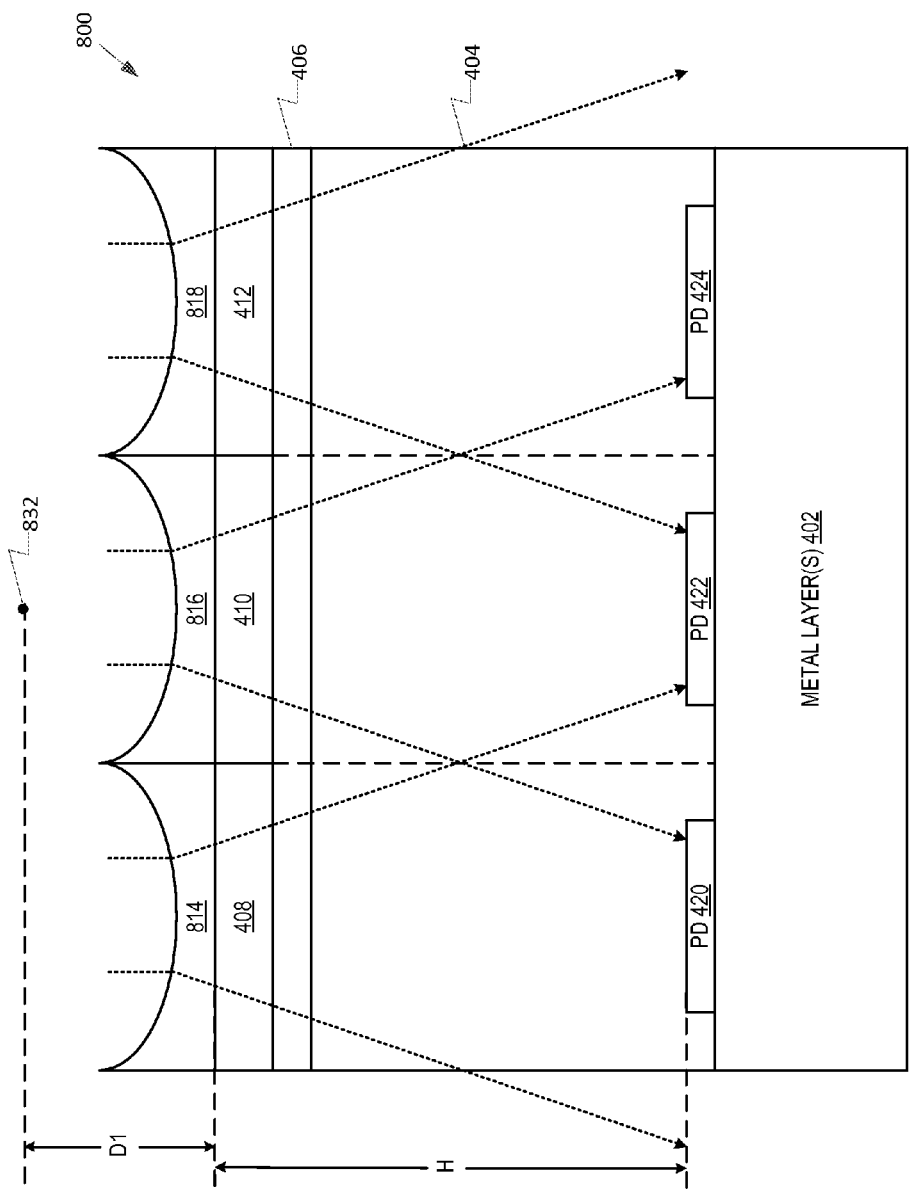
FIG. 8 is a cross-sectional view of three pixels of an imaging sensor having concave microlenses, in accordance with an embodiment of the present disclosure.

FIG. 8 is a cross-sectional view of three pixels of an imaging sensor 800 having concave microlenses 814-818, in accordance with an embodiment of the present disclosure. As can be seen from FIG. 8, each pixel includes a microlens having the same effective focal depth of D1. Focal depths of negative lenses are imaginary, because the lenses diverge light instead of converging light. Here, each pixel included in imaging sensor 800 is configured to increase optical crosstalk by directing incident light onto the photodiode of an adjacent pixel. Similar to the positive microlenses, discussed above, it may be desirable that the light directed into neighboring pixels does not extend beyond the immediately adjacent pixels. Otherwise, the optical crosstalk may be too excessive. Thus, in one embodiment, the maximum amount of optical crosstalk is limited by ensuring that the effective focal depth D1 of each focal point (e.g., focal point 832) is greater than or equal to one-third the height H of the pixel.

Figure 9B:
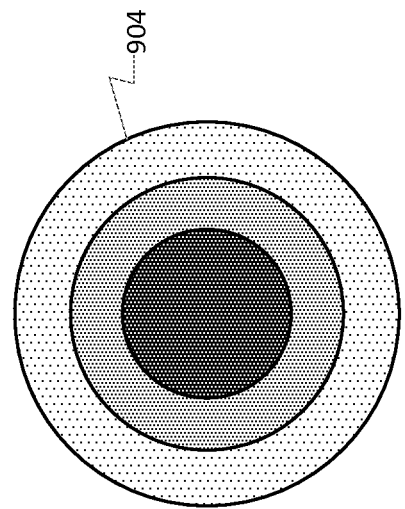
FIG. 9B illustrates a grayscale mask made from a negative photoresist for forming a concave microlens, in accordance with an embodiment of the present disclosure.
Figure 9A:
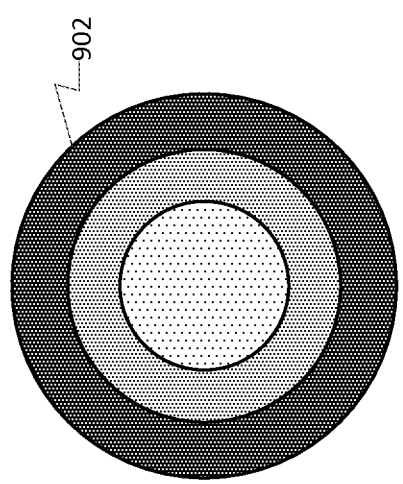
FIG. 9A illustrates a grayscale mask made from positive photoresist for forming a concave microlens, in accordance with an embodiment of the present disclosure.

In one embodiment, a process that uses a gray scale mask, similar to that described above, is employed to fabricate a concave microlens. FIG. 9A illustrates a grayscale mask 902 made from positive photoresist for forming a concave microlens, in accordance with an embodiment of the present disclosure. If a positive photoresist, such as with grayscale mask 902, is used to make a concave microlens, then the inner portion of the mask must be lighter than the outer portion of the mask. Thus, the inner portion of the resulting microlens will be relatively thinner, whereas the outer portion will be relatively thicker. FIG. 9B illustrates a grayscale mask 904 made from a negative photoresist for forming a concave microlens, in accordance with an embodiment of the present disclosure.

Figure 10:
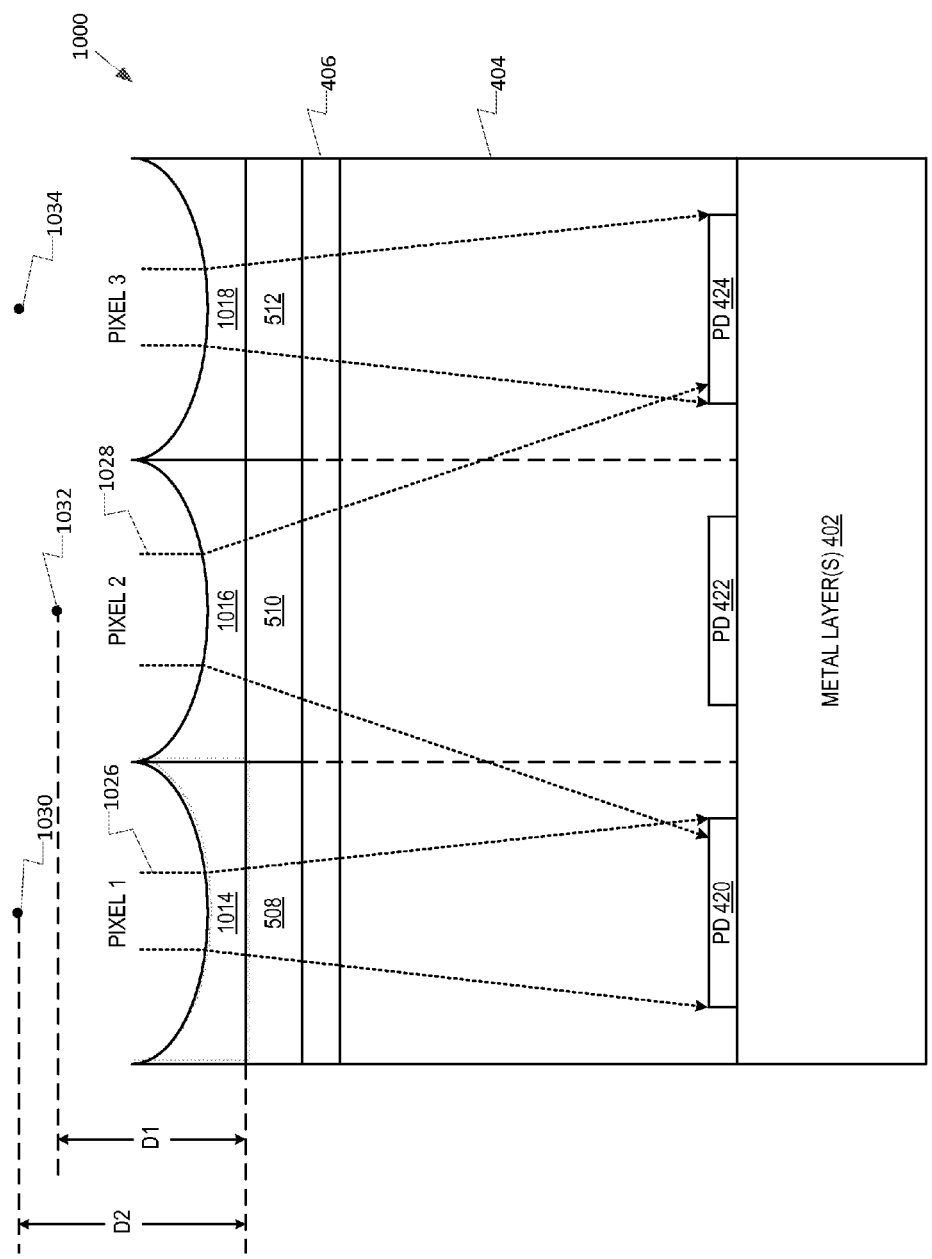
FIG. 10 is a cross-sectional view of three pixels of an imaging sensor having concave microlenses of varying effective focal depths, in accordance with an embodiment of the present disclosure.

In the embodiment of FIG. 8, each of the negative microlenses has the same effective focal depth D1. However, in other embodiments, only some pixels may be configured to increase optical crosstalk. That is, using negative microlenses, some pixels may direct incident light onto the photodiode of an adjacent pixel, while the adjacent pixel contains incident light to its own photodiode. As discussed above, it may be advantageous to have color pixels increase crosstalk, but to have clear pixels not. In other words, light incident on color pixels may be directed into neighboring clear pixels, but light incident on clear pixels will substantially remain within the clear pixels. To illustrate, FIG. 10 is a cross-sectional view of three pixels of an imaging sensor 1000 having concave microlenses 1014-1018 of varying effective focal depths, in accordance with an embodiment of the present disclosure. Concave microlenses 1014-1018 may be fabricated to have differing effective focal depths by varying the material used between microlenses and photodiodes and/or varying the material, size and shape of the microlenses. As shown in FIG. 10, focal point 1032 has an effective focal depth D1 that is shorter than the effective focal depth D2 of focal point 1030. In one embodiment, light filters 508 and 512 are clear filters, while light filter 510 is a color filter (e.g., red, green, or blue). Thus, color pixel 2 is configured to receive light 1028 and direct at least some of light 1028 onto photodiodes 420 and 424 of adjacent clear pixels 1 and 3. Clear pixel 1 is configured to have an effective focal depth D2, such that light 1026 is received at negative microlens 1014 and is directed to be incident upon photodiode 420 and not onto an adjacent photodiode.

Figure 11:
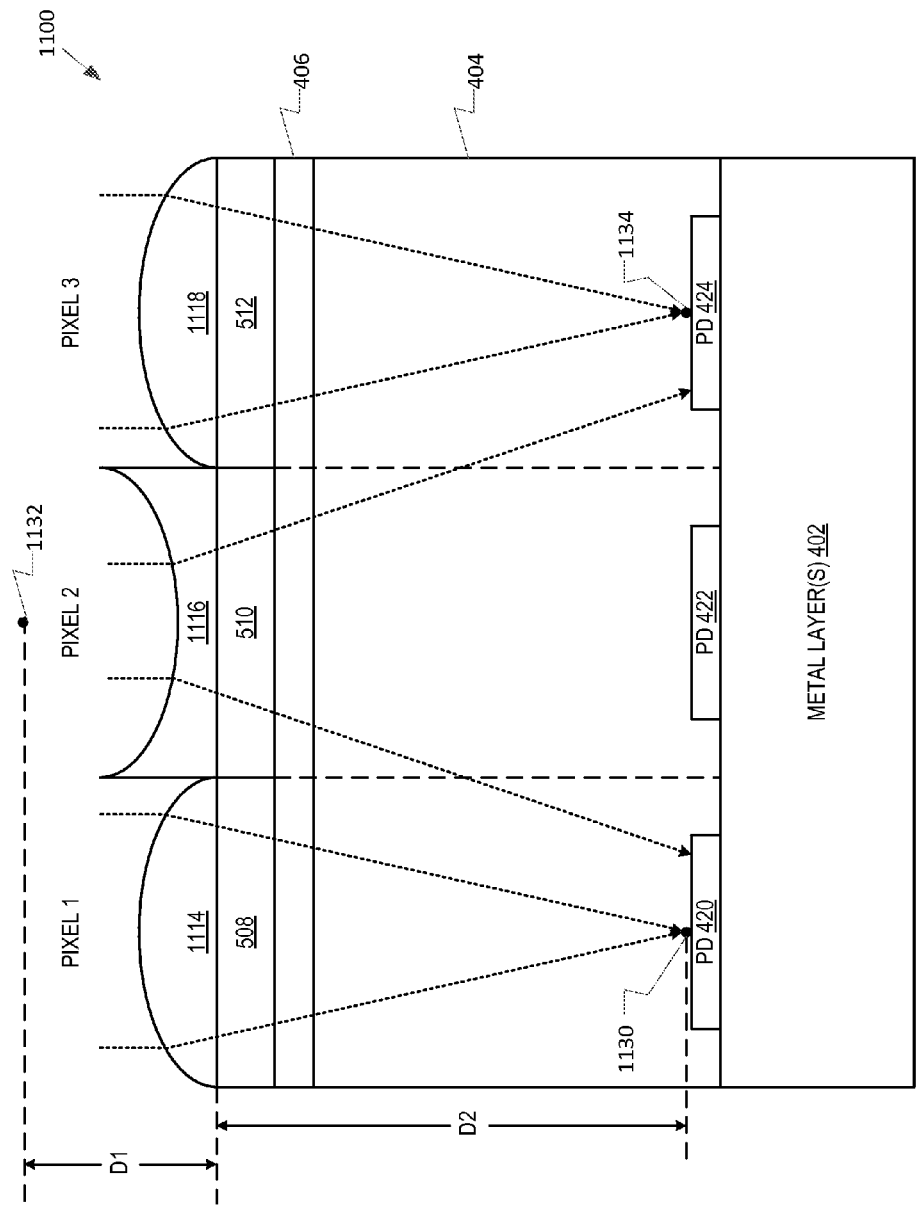
FIG. 11 is a cross-sectional view of three pixels of an imaging sensor having both convex and concave microlenses, in accordance with an embodiment of the present disclosure.

FIG. 11 is a cross-sectional view of three pixels of an imaging sensor 1100 having both convex and concave microlens, in accordance with an embodiment of the present disclosure. In the illustrated embodiment, pixels 1 and 3 are clear pixels having clear light filters 508 and 512, respectively, while pixel 2 is a color pixel having a color filter 510. Focal point 1132 of pixel 2 has an effective focal depth of D1 such that at least some of the light incident onto negative (i.e., concave) microlens 1116 is directed to photodiodes 420 and 424 of adjacent clear pixels 1 and 2. Focal points 1130 and 1134 have an effective focal depth D2 such that light that is incident onto the positive (i.e., convex) microlenses is directed only to their respective photodiode and not to an adjacent one. In this embodiment, the color pixels may increase optical crosstalk while clear pixels do not.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
   a first pixel having a first light sensitive element, a first light filter, and a first microlens; and
   a second pixel, disposed adjacent to the first pixel, having a second light sensitive element, a second light filter, and a second microlens, wherein the first pixel is configured to direct at least some of the light received at the first microlens to the second light sensitive element of the second pixel to increase optical crosstalk;
   wherein the first microlens is concave to diverge at least some of the light incident upon the first microlens to the second light sensitive element, wherein the first microlens has a first focal point at a first effective focal depth, and wherein the first effective focal depth of the first focal point is greater than or equal to one third of a height of the first pixel.

2. The image sensor of claim 1 wherein the first light filter is a color light filter and the second light filter is a clear light filter, wherein the second microlens is concave and has a second focal point at a second effective focal depth, wherein the second effective focal depth is greater than the first effective focal depth, such that light incident on the second microlens is substantially incident on the second light sensitive element and not on the first light sensitive element.

3. The image sensor of claim 1 wherein the first light filter is a color light filter and the second light filter is a clear light filter, wherein the second microlens is convex, such that light incident on the second microlens is substantially incident on the second light sensitive element and not on the first light sensitive element.

4. An image sensor comprising:
   a plurality of pixels arranged into an array of rows and columns, wherein the plurality of pixels includes color pixels and clear pixels arranged in the array according to a pattern such that the clear pixels are arranged on a diagonal of the array;

at least one of the color pixels having a first light sensitive element, a color light filter, and a first microlens; and at least one of the clear pixels, disposed adjacent to the at least one color pixel, having a second light sensitive element, a clear light filter, and a second microlens, wherein the at least one color pixel is configured to direct at least some of the light received at the first microlens to the second light sensitive element of the at least one clear pixel to increase optical crosstalk;

wherein the first microlens is concave to diverge at least some of the light incident upon the first microlens to the second light sensitive element of the clear pixel, wherein the first microlens has a first focal point at a first effective focal depth, and wherein the first effective focal depth of the first point is greater than or equal to one third of a height of the first pixel.

5. The image sensor of claim 4 wherein the second microlens is concave and has a second focal point at a second effective focal depth, wherein the second effective focal depth is greater than the first effective focal depth, such that light incident on the second microlens is substantially incident on the second light sensitive element and not on the first light sensitive element.

6. The image sensor of claim 4 wherein the second microlens is convex, such that light incident on the second microlens is substantially incident on the second light sensitive element and not on the first light sensitive element.

7. A method of reducing color aliasing in an image sensor, the method comprising:

receiving light at a first microlens of a first pixel of the image sensor, the first pixel including the first microlens, a first light sensitive element, and a first light filter, wherein the first microlens has a first focal point at a first effective focal depth, and wherein the first effective focal depth of the first focal point is greater than or equal to one third of a height of the first pixel;

receiving light at a second microlens of a second pixel of the image sensor, the second pixel including the second microlens, a second light sensitive element, and a second light filter, wherein the first light filter is a color light filter and the second light filter is a clear light filter;

directing at least some of the light received at the first microlens to the second light sensitive element of the second pixel to increase optical crosstalk; and directing light received at the second microlens to the second light sensitive element and not to the first light sensitive element.

8. The method of claim 7 wherein the first microlens and the second microlens are concave.

9. The method of claim 7 wherein the first microlens is concave and the second microlens is convex.

* * * * *

UNITED STATES PATENT AND TRADEMARK OFFICE
CERTIFICATE OF CORRECTION

PATENT NO. : 9,935,145 B2
APPLICATION NO. : 14/926220
DATED : April 3, 2018
INVENTOR(S) : Wu Page 1 of 1

It is certified that error appears in the above-identified patent and that said Letters Patent is hereby corrected as shown below:

In the Claims

| Column | Line | Error |
|---|---|---|
| 9 (Claim 4, Line 21) | 15 | "focal depth of the first point" should read --focal depth of the first focal point-- |

Signed and Sealed this
Twenty-third Day of April, 2019

Andrei Iancu
*Director of the United States Patent and Trademark Office*